United States Patent [19]
Oh

[11] Patent Number: 5,953,267
[45] Date of Patent: Sep. 14, 1999

[54] SYNCHRONOUS DYNAMIC RANDOM ACCESS MEMORY FOR STABILIZING A REDUNDANT OPERATION

[75] Inventor: Young Nam Oh, Kyoungki-do, Rep. of Korea

[73] Assignee: Hyundai Electronics Industries, Kyoungki-Do, Rep. of Korea

[21] Appl. No.: 09/104,993

[22] Filed: Jun. 26, 1998

[30] Foreign Application Priority Data

Jun. 30, 1997 [KR] Rep. of Korea .................. 97-30226

[51] Int. Cl.[6] ............................................. G11C 7/00
[52] U.S. Cl. ............... 365/200; 365/230.06; 365/225.7; 365/233
[58] Field of Search .................. 365/200, 230.03, 365/230.06, 225.7, 185.23, 4, 114, 233

[56] References Cited

U.S. PATENT DOCUMENTS

| | | | |
|---|---|---|---|
| 5,297,085 | 3/1994 | Choi et al. ............................. | 365/200 |
| 5,424,986 | 6/1995 | McClure . | |
| 5,471,426 | 11/1995 | McClure . | |
| 5,475,640 | 12/1995 | Kersh, III et al. . | |
| 5,550,776 | 8/1996 | Seo et al. . | |
| 5,612,918 | 3/1997 | McClure . | |
| 5,717,651 | 2/1998 | Kikukawa et al. ..................... | 365/233 |
| 5,748,543 | 5/1998 | Lee et al. ............................. | 365/200 |

*Primary Examiner*—David Nelms
*Assistant Examiner*—Thong Le
*Attorney, Agent, or Firm*—Thelen Reid & Priest L.L.P.

[57] ABSTRACT

A synchronous dynamic random access memory (DRAM) for stabilizing a redundant operation prevents a redundant decoder's malfunction which occurs in a step of latching a redundant decoder according to a fuse programmable information during a power-up time. The synchronous DRAM for stabilizing a redundant operation includes: a column address pre-decoder which generates a plurality of decoded addresses needed by the column decoder, and connects them to a corresponding column decoder; a redundant column pre-decoder which generates a fuse-programmable address needed by the spare column decoder; a row address pre-decoder which generates a plurality of decoded addresses needed by the row decoder, and connects them to a corresponding row decoder; a redundant row pre-decoder which generates a fuse-programmable address needed by the spare row decoder; and a redundant enable signal generator which generates a global enable signal for driving both the redundant row pre-decoder and the redundant column pre-decoder, after a plurality of address inputs and a power-supply voltage being input to both the redundant column pre-decoder and the redundant row pre-decoder are reached to a stable state.

3 Claims, 5 Drawing Sheets

SYNCHRONOUS DYNAMIC RANDOM ACCESS MEMORY FOR STABILIZING A REDUNDANT OPERATION

BACKGROUND OF THE INVENTION

1. Field of the Invention

The present invention relates generally to a synchronous dynamic random access memory. More particularly, it relates to a synchronous DRAM for stabilizing a redundant operation which prevents a redundant decoder malfunction which occurs in a step of latching a redundant decoder according to a fuse programmable information during a power-up time.

2. Description of the Prior Art

Generally, in a conventional DRAM having a redundant circuit, a power-supply voltage (or Vpp) is changed by an external environment, or a plurality of address signals being input to a redundant decoder are unstable, thereby making a malfunction in the sensing and latch operations of the redundant decoder.

SUMMARY OF THE INVENTION

The present invention is directed to a synchronous DRAM for stabilizing a redundant operation which substantially obviates the above-described problem due to limitations and disadvantages of the related art.

It is an object of the present invention to provide a synchronous DRAM for stabilizing a redundant operation which drives a redundant decoder by using a redundant enable signal being generated after a power-supply voltage (or Vpp) and a plurality of input signals of the redundant decoder become stable, and then performs the sensing and latch operations, thereby preventing a malfunction which may occur in the sensing and latch operations of the redundant decoder.

In order to realize the above object, in a synchronous DRAM having a memory cell array block made of a plurality of memory cells; a row decoder for selecting and driving a word line; a column decoder for selecting and driving a bit line; a spare memory cell array block for substituting a defective cell, a defective word line or a bit line inside of the memory cell array block; a spare row decoder for selecting a spare word line or a cell of the spare memory cell array block; and a spare column decoder for selecting a spare bit line or a cell of the spare memory cell array block, the synchronous DRAM includes:

a column address pre-decoder which generates a plurality of decoded addresses needed by the column decoder, and connects them to the corresponding column decoder;

a redundant column pre-decoder which generates a fuse-programmable address needed by the spare column decoder;

a row address pre-decoder which generates a plurality of decoded addresses needed by the row decoder, and connects them to the corresponding row decoder;

a redundant row pre-decoder which generates a fuse-programmable address needed by the spare row decoder; and a redundant enable signal generator which generates a global enable signal for driving both the redundant row pre-decoder and the redundant column pre-decoder, which occur after a plurality of address inputs and a power-supply voltage being input to both the redundant column pre-decoder and the redundant row pre-decoder are reached to a stable state.

The redundant enable signal generator includes:

a power-up circuit which is connected between a power-supply voltage and a substrate voltage, and outputs a signal of sensing a variation of the power-supply voltage;

a mode register set command decoder circuit which outputs a first logic signal when receiving a mode register set command;

a signal selecting circuit which selects an output signal of the mode register set command decoder circuit or an output signal of the power-up circuit;

a latch circuit which is connected between the signal selecting circuit and an output terminal; and a driver circuit which is connected between the latch circuit and the output terminal by using even inverters.

The redundant column pre-decoder includes:

first to third fuse circuits which output logic values different from one another according to the fuse state;

a control signal generator which outputs a signal mixed with output signal of the first fuse circuit and a redundant power-up signal;

a first switching element which is switched by an output signal of the first fuse circuit, and transmits a ground potential to an output terminal in a normal operation;

second to fifth switching elements for selecting a normal pre-decoding address signal, and outputting it to the output terminal; and a level shift circuit which receives a plurality of fuse-programmable address inputs from the second and third fuse circuits and then controls operations of the second to fifth switching elements, where it occurs if an operation is activated by an output signal of the control signal generator and a plurality of output signals of the second and third fuse circuits.

Additional features and advantages of the invention will be set forth in the description which follows, and in part will be apparent from the description, or may be learned by practice of the invention. The objective and other advantages of the invention will be realized and attained by the structure particularly pointed out in the written description and claims hereof as well as the appended drawings.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the drawings.

In the drawings.

DETAILED DESCRIPTION OF THE PREFERRED EMBODIMENT

Reference will now be made in detail to the preferred embodiment of the present invention, examples of which are illustrated in the accompanying drawings.

Figure 1:
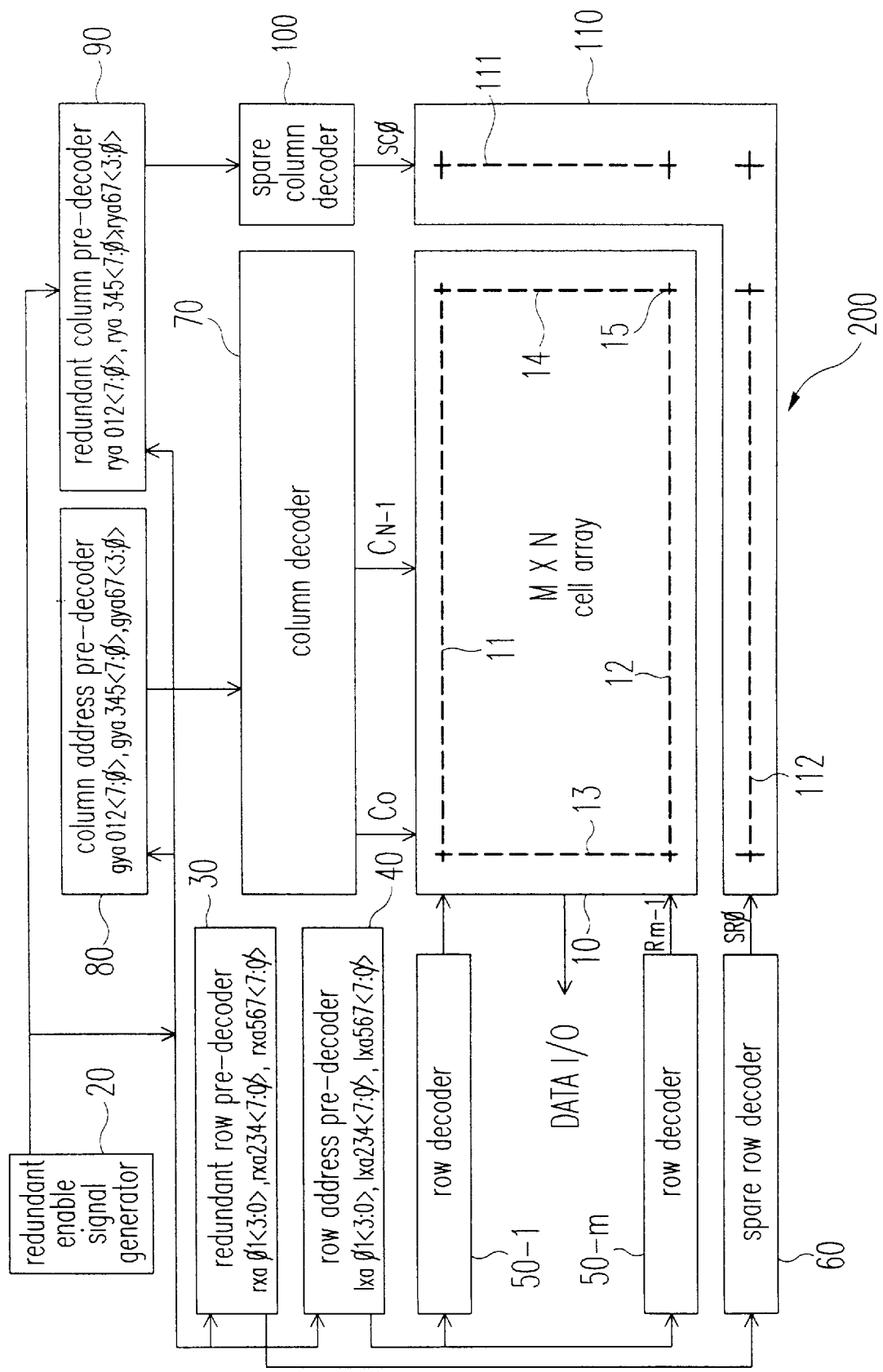
FIG. 1 is a block diagram of a synchronous DRAM in accordance with a preferred embodiment of the present invention.

FIG. 1 is a block diagram of a synchronous DRAM in accordance with a preferred embodiment of the present invention.

Referring to FIG. 1, the synchronous DRAM includes:

a memory cell array block 10 made of a plurality of memory cells;

a row decoder 50 for selecting and driving a word line;

a column decoder 70 for selecting and driving a bit line;

a spare memory cell array block 110 for substituting a defective cell, a defective word line or a bit line inside of the memory cell array block 10;

a spare row decoder 60 for selecting a spare word line or a cell of the spare memory cell array block 110;

a spare column decoder 100 for selecting a spare bit line or a cell of the spare memory cell array block 110;

a column address pre-decoder 80 which generates a plurality of decoded addresses needed by the column decoder 70, and connects them to the corresponding column decoder;

a redundant column pre-decoder 90 which generates a fuse-programmable address needed by the spare column decoder 100;

a row address pre-decoder 40 which generates a plurality of decoded addresses needed by the row decoder 50, and connects them to the corresponding row decoder;

a redundant row pre-decoder 30 which generates a fuse-programmable address needed by the spare row decoder 60; and a redundant enable signal generator 20 which generates a global enable signal for driving both the redundant row pre-decoder 30 and the redundant column pre-decoder 90, after a plurality of address inputs and a power-supply voltage being input to both the redundant column pre-decoder 90 and the redundant row pre-decoder 30 are reached to a stable state.

As shown in FIG. 1, one integrated memory circuit 200 of the redundant circuit configuration includes m-bit row address, n-bit column address, M-row and N-column, where $M=2^m$ and $N=2^n$.

Although FIG. 1 briefly shows one spare column and one spare column, a plurality of spare rows and columns can be used with the corresponding decoders without changing a basic principle.

The row lines 11 and 12 are connected to normal row decoders 50_1 and 50_m. A spare row line 112 is connected to the spare row decoder 60. Normal column lines 13 and 14 are respectively connected to the normal column decoder 70. The spare column line 11 is connected to the spare column decoder 100. The row address pre-decoder 40 generates the decoded addresses (if m=8, 256 rows; gxa01<3:0>, gxa234<7:0>, gxa567<7:0>) needed by the normal row decoders 50_1 and 50_m, and connects them to a corresponding row decoder. The redundant row address pre-decoder 30 generates a fuse-programmable address needed by the spare row decoder 60.

The column address pre-decoder 80 generates the decoded addresses (if n=8, 256 columns; gya012<7:0>, gya345<7:0>, gya67<3:0>) needed by the normal column decoder 70, and connects them to a corresponding column decoder. The redundant column address pre-decoder 90 generates a fuse-programmable address needed by the spare column decoder 100.

The redundant enable signal generator 20 generates a global enable signal 'Redpwrup' for driving both the redundant row address pre-decoder 30 and the redundant column address pre-decoder 90.

The redundant pre-decoders 30 and 90 according to the preferred embodiment of the present invention generate input signals (rxa01<3:0>, rxa234<7:0> and rxa567<7:0>, or rya012<7:0>, rya345<7:0> and rya67<3:0>) needed by the last decoders 60 and 100, if the global enable signal 'Redpwrup' is at an enable state (at which a logic low level signal is changed to a logic high level signal) in the redundant enable signal generator 20.

Herein, since the decoders (30, 40, 50_1, 50_m, 60, 70, 80 and 100) of various kinds can be easily made by those skilled in the art, a detailed description about the circuit configuration and the circuit operation will be omitted below. A preferred embodiment of the redundant enable signal generator 20 and the redundant decoder 90 using the redundant enable signal generator 20 will now be described below.

Figure 2:
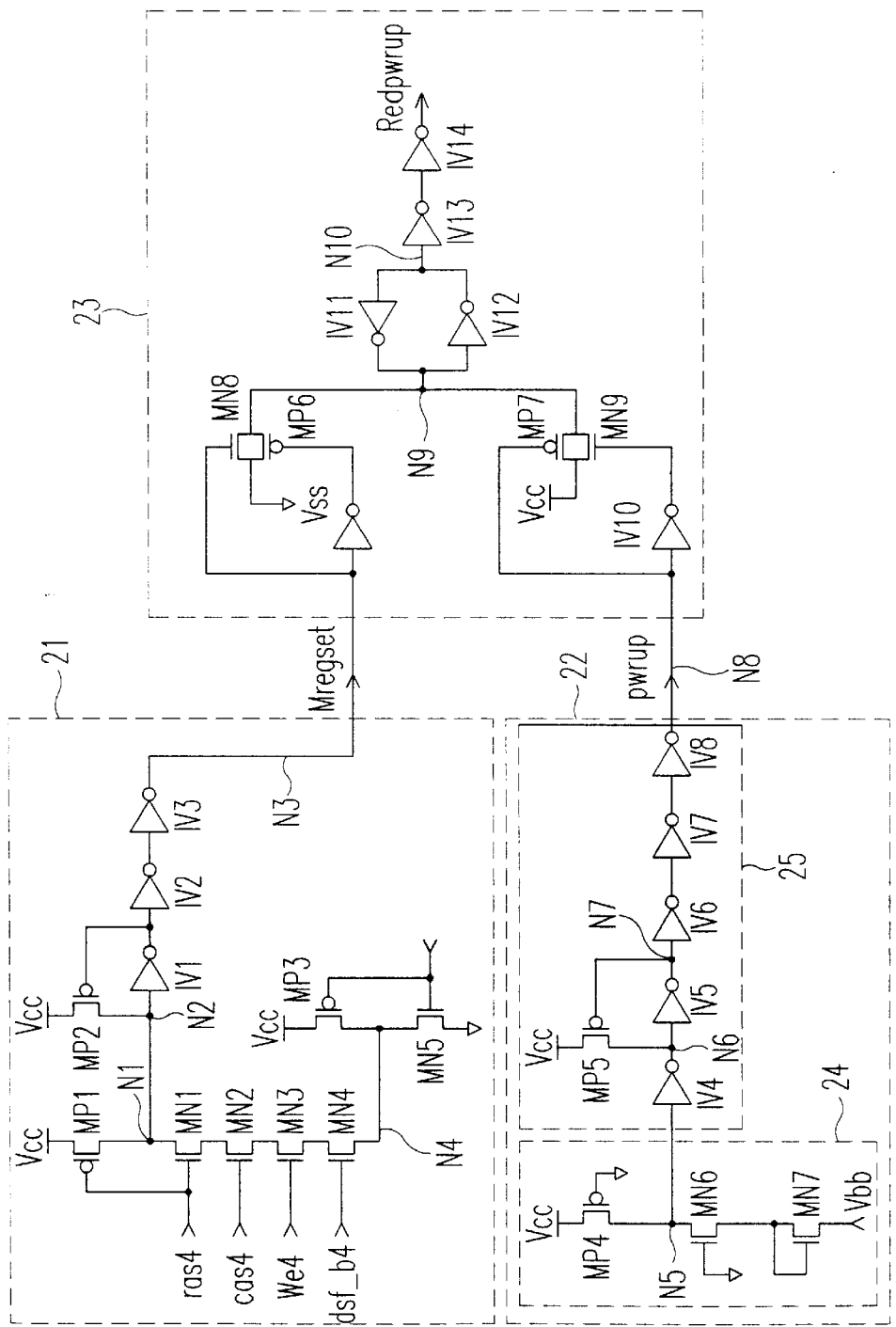
FIG. 2 is a circuit diagram of a redundant enable signal generator shown in FIG. 1 in accordance with a preferred embodiment of the present invention.
Figure 3:
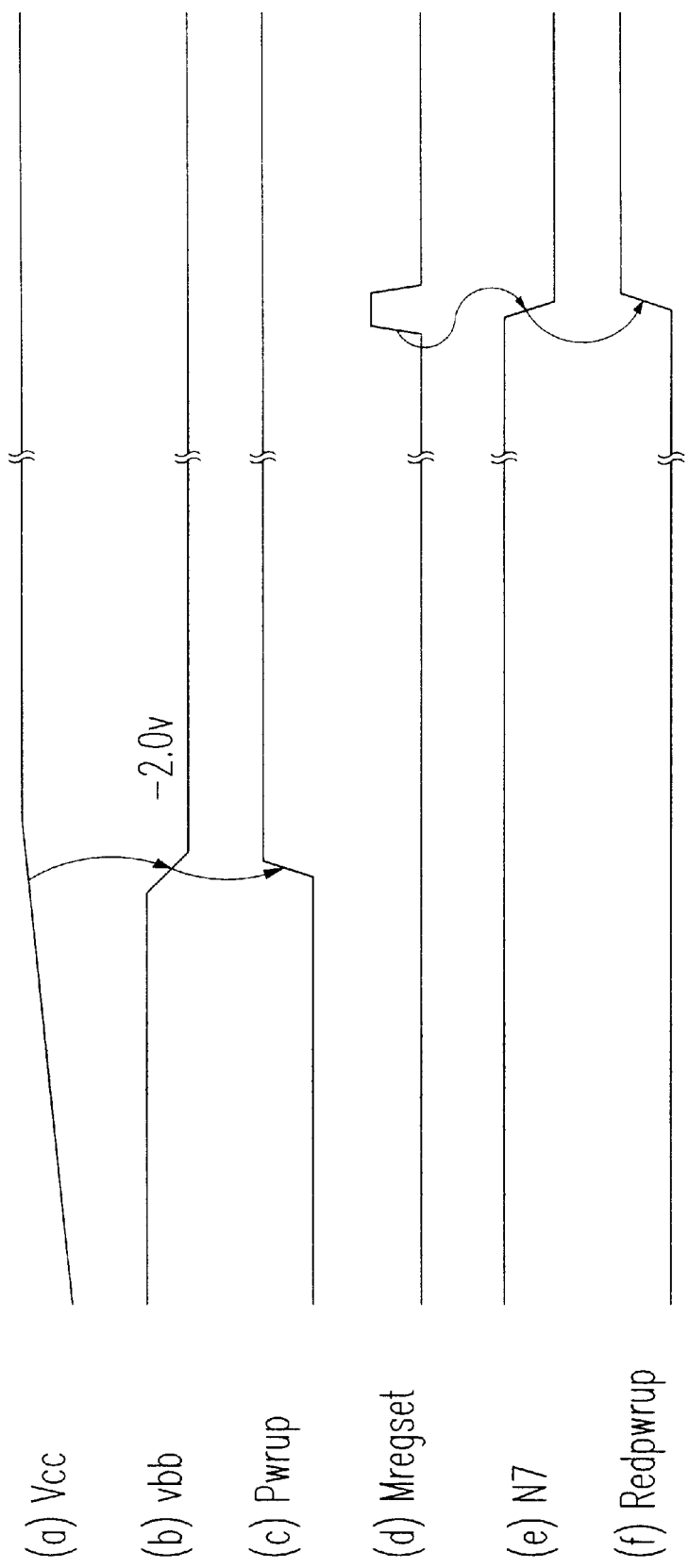
FIG. 3 is a timing diagram of a redundant enable signal generator shown in FIG. 2 in accordance with a preferred embodiment of the present invention.

FIG. 2 is a circuit diagram of a redundant enable signal generator 20 shown in FIG. 1 in accordance with a preferred embodiment of the present invention; and FIG. 3 is a timing diagram of a redundant enable signal generator 20 shown in FIG. 2 in accordance with a preferred embodiment of the present invention.

A sensing portion 24 of a power-up circuit 22 of FIG. 2 maintains a logic high level because a PMOS transistor MP4 is turned on at a node N5. But, as shown in FIG. 3, if a voltage Vbb is operated by a variation of a power-supply voltage Vcc, NMOS transistors MN6 and MN7 positioned between the node N5 and the voltage Vbb are turned on, thereby the node N5 is changed to a logic low level.

Also, a driver 25 which is positioned between the node N5 and an output signal line 'pwrup' includes inverters IV4, IV5, IV6, IV7 and IV8 and PMOS transistor MP5. By only a buffer connection, the logic low level of the node N5 is changed to a logic high level of the signal 'pwrup', thus finishing the power-up operation. The PMOS transistor MP5 of which source is connected to the power-supply voltage Vcc, drain is connected to a node N6, and gate is connected to a node N7 prevents the node N6 from floating.

A command decoder 21 of FIG. 2 is synchronized by a clock signal, and generates a plurality of internal commands of a synchronous memory. In the present invention, the command decoder 21 generates a mode register set signal 'Mregset' as being one of the internal commands.

The mode register set signal 'Mregset' is a command performed when a chip is idle. A condition for generating this command 'Mregset' is that a logic low state of signals CS, RAS (row-address strobe), CAS (column-address strobe), WE (write enable) and DSF and an operation code 'opcode' should be satisfied at a clock rising edge. The purpose of the mode register set signal 'Mregset' is to adjust both a CAS (column-address strobe) latency and a burst length.

A block 21 shown in FIG. 2 depicts a mode register set command decoder. In operation, a node N1 has a logic high level because PMOS transistor MP1 is turned on in the initial idle state. If the mode register set command is input to the block 21, high-pulse type input signals are connected to the signal lines CS4, RAS4, CAS4, We4 and dsf_b4. Therefore, NMOS transistors MN1, MN2, MN3 and MN4 connected in series are turned on, a node N1 is changed to a logic low level, and the signal 'Mregset' passing through buffers IV1, IV2 and IV3 is changed to a logic high level at a node N3. When a pulse-type input signal RAS4 is changed from a logic high level to a logic low level, the logic low level of the node N1 is changed to a logic high level. As a result, the last output signal 'Mregset' outputs a high pulse-type output signal at every the mode register set command's input.

A driver circuit 23 of the redundant enable signal generator 20 includes a first switching portion made of IV10, MP7 and MN9, a second switching portion made of IV9, MP6 and MN8, and a register portion made of IV11 and IV12, and a buffer portion made of IV13 and IV14. The signal 'pwrup' for the first switching element made of IV10, MP7 and MN9 at a node N8 is connected to a PMOS of the first fast-transistor made of MP7 and MN9. A complement signal 'pwrup_b' generated by making the signal 'pwrup' pass through an inverter IV10, is connected to NMOS of the first fast-transistor made of MP7 and MN9. One input terminal of the first fast-transistor made of MP7 and MN9 is connected to a power-supply voltage Vcc, and the output terminal thereof is connected to one output terminal of the second switching portion made of IV9, MP6 and MN8 and one input terminal of the register portion made of IV11 and IV12.

A signal 'mregset' of the second switching portion made of IV9, MP6 and MN8 is connected to NMOS transistor of the second fast-transistor made of MP6 and MP8. A complement signal 'mregset_b' generated by making the signal 'mregset' pass through an inverter IV9, is connected to PMOS transistor of the second past-transistor made of MP6 and MN8. One input terminal of the second fast-transistor made of MP7 and MN9 is connected to a ground voltage, one output terminal is connected to both one output terminal of the first switching portion and one input terminal of the register portion. The register portions made of IV11 and IV12 are meshed to each other, thereby making a latch circuit. Output terminals of the first and second switching portions are connected to an input node N9. An input signal of the buffer portion made of IV13 and IV14 is connected to an output node N10. The buffer portion made of IV13 and IV14 is a buffer connection for generating the last output signal 'redpwrup' from the register portion made of IV11 and IV12.

FIG. 3 is a timing diagram of a redundant enable signal generator 20 shown in FIG. 2. A detailed description about FIG. 3 will now be described below to obtain more accurate understanding.

If a power-supply voltage Vcc is turned on as shown in FIG. 3(a), a voltage Vbb is changed to a negative potential −2.0(Volt) as shown in FIG. 3(b). As the voltage Vbb changes, the last output signal 'pwrup' of the power-up circuit 22 of FIG. 2 changes its state from a logic low level to a logic high level, thereby finishing a power-up initial operation. As a result, the second switching portion made of IV9, MP6 and MN8 is turned off by the logic low level signal being an output signal of an idle state of a command decoder 21.

Here, the initial operation completion means a logic high state of the signal 'pwrup', so that the first switching portion made of IV10, MP7 and MN9 maintains its own turn-off state. Although the initial operation of the power-up circuit 22 was completed, the first switching portion made of IV10, MP7 and MN9 continuously maintains the logic high state at a node N9, and the register portion made of IV11 and IV12 maintains a logic low state at a node N10. If an initial mode register set command of a synchronous memory is input to the command decoder 21 of FIG. 2 after a predetermined time, an output signal 'Mregset' generates a high level pulse signal. Accordingly, a state, in which a logic low voltage (i.e., a ground voltage) being one input signal of the second switching portion made of IV9, MP6 and MN8 is stored in the register portion made of IV11 and IV12 during a high pulse turn-on time of the signal 'Mregset', is maintained such that both a logic low state at the node N9 and a logic high state at the node N10 are made.

The output node N10 of the register portion made of IV11 and IV12 maintains a logic high level state of the last output signal 'redpwrup' after a buffer connection made of IV13 and IV14. The subsequent mode register set commands do not change the logic high level state of the signal 'redpwrup', because the same contents are input to the register portion made of IV11 and IV12.

Hereinafter, a redundant decoder constructed by using the redundant enable signal generator 20 described above and a circuit rya67<3:0> of the redundant column pre-decoder 90 of FIG. 1 will now be described.

Figure 4:
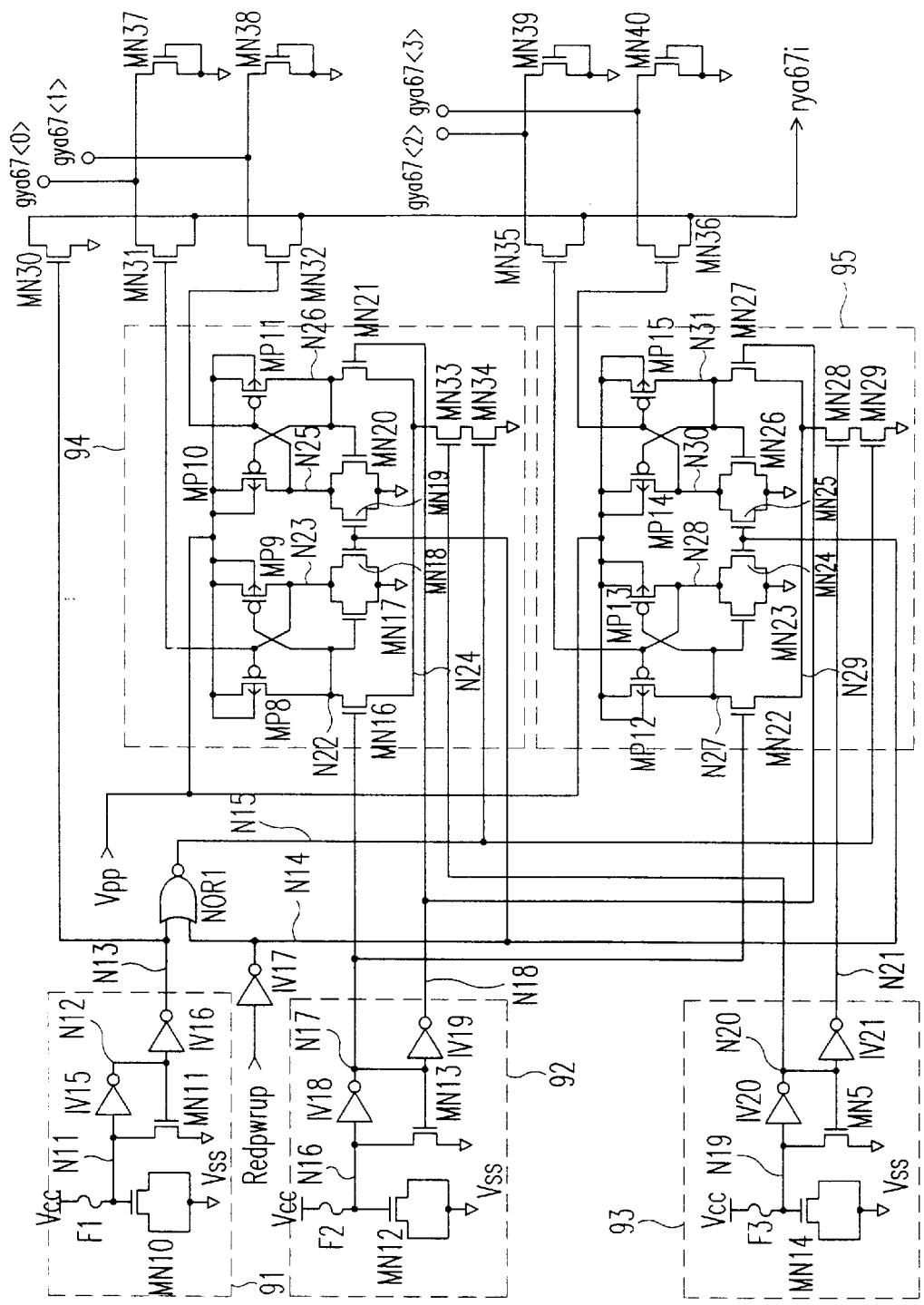
FIG. 4 is a circuit diagram of a redundant column pre-decoder shown in FIG. 1 in accordance with a preferred embodiment of the present invention.

FIG. 4 is a circuit diagram of a redundant column pre-decoder 90. The purpose of the circuit of FIG.4 is to generate a signal 'rya67i'. The circuit of FIG. 4 includes three fuse-program portions 91, 92 and 93, a control signal portion made of IV7 and NOR, two level shifters 94 and 95, and output portion made of MN30–MN32 and MN35–MN40.

First, a fuse F1 is connected between the fuse program portion 91 and a node N11 in the fuse program portion 91. NMOS transistor MN11 connected in parallel to a capacitor MN10 is connected between a node N11 and a terminal Vss. Inverters IV15 and IV16 are connected to the node N11. A node Nd between the inverters IV15 and IV16 is connected to a gate of the NMOS transistor MN11. A fuse state detection signal from an output terminal of the inverter IV15 in a node Nd is connected to a gate of the NMOS transistor MN11. An output terminal of the inverter IV16 outputs the fuse state detection signal in a node N13.

If a defective column is not changed by using a global enable signal of the redundant column pre-decoder 90 of FIG. 1 (that is, if a normal column is used), the node NC outputs a pre charge state (means that the signal 'rya67i' is at a logic low state by turning on NMOS transistor MN30) of the last output signal 'rya67i' and the complement enable signals of the level shifters 94 and 95.

Another the fuse program portions 92 and 93 have the same configuration as the above fuse program portion 91. However, they output the complement signals at nodes N17, N18, N19 and N20 and provide the level shifters 94 and 95 with four address input signals caused by two address bits.

The control signal portion made of IV17 and NOR1 mixes the enable signal at the node NC with the signal 'redpwrup'. The signal 'redpwrup' is applied to a node NC through an inverter IV17, the nodes N14 and N13 are connected to the NOR gate NOR1, and an output signal is generated at a node NC, thereby providing the level shifters 94 and 95 with the complement enable signals.

If the complement enable signals N14 and N15 are activated, the level shifters 94 and 95 receive four fuse programmable address input signals N17, N18, N20 and N21 from the fuse program portion 92 or 93, thereby generating four signals N23, N25, N28 and N30 for controlling four NMOS transistors MN31, MN35 and MN36 used in the output portions MN30–MN32 and MN35–MN40. The signals N23, N25, N28 and N30 to control four NMOS transisters MN31, MN32, MN35 and MN36 are generated for an idle time wherein the signal 'redpwrup' has a logic low level.

As to the operations of the level shifters 94 and 95 for the idle time, since NMOS transitors MN18 and MN19 of which gates are connected to the node N14 are turned on, nodes N23 and N25 are at a ground potential. Since PMOS transistor MP8 of which gate is connected to the node N23 is turned on, a node N22 maintains a Vpp potential (about 1.5 Vcc). Since PMOS transistor MP11 of which gate is connected to the node N25 is turned on, a node N26 maintains a Vpp potential (about 1.5 Vcc). PMOS transistor MP9 of which gate is connected to the node N22, positioned between the node N23 and the voltage Vpp, is turned off. MNOS transistor MN10 of which gate is connected to the node N26, positioned between the node N25 and the voltage Vpp, is turned off. NMOS transistor MN17 of which gate is connected to the node N22, positioned between the node N23 and the ground voltage, is turned on. NMOS transistor MN20 of which gate is connected to the node N26, positioned between the node N25 and the ground voltage, is turned on. MNOS transistors MN18 and MN21 receiving the fuse programmable address via their gates, positioned between the node N22 and N24, are turned off. A current sink which is connected between the node N24 and the ground voltage by a serial connection between NMOS transistors MN33 and MN34 receives the fuse programmable address and the global enable signal at the node N15 through each gate of the NMOS transistors MN33 and MN34.

As to the operations at an active state, one of the signals precharged with a Vpp potential in the nodes N22 and N26 is discharged to the ground voltage according to an on/off state of the NMOS transistors MN18, MN21, MN33 and MN34. According to this discharge operation, one of the output nodes N23 and N25 rises to the Vpp potential, thereby finishing a decoding operation.

The output portions MN30–MN32 and MN35–MN40 select one of the normal pre-decoding input signals gya67<3:0>, and transmits it to transistors MN31, MN32, MN35 and MN36 are turned on, a normal pre-decoding signal is transmitted to the last output signal line 'rya67i'. The NMOS transistor MN31 is connected to the node N23 via its gate, is connected to the signal gya67<0> via its source, and is connected to the signal rya67i via its drain. The NMOS transistor MN32 is connected to the node N25 via its gate, is connected to the signal gya67<1> via its source, and is connected to the signal rya67i via its drain. The NMOS transistor MN35 is connected to the node N28 via its gate, is connected to the signal gya67<2> via its source, and is connected to the signal rya67i via its drain. The NMOS transistor MN36 is connected to the node NE via its gate, is connected to the signal gya67<3> via its source, and is connected to the signal rya67i via its drain.

NMOS transistor MN30 is connected between the last output signal rya67i and the ground voltage, and is connected to the global enable signal of the node N13 via its gate. The NMOS transistor MN30 makes the last output signal rya67i maintain a pre charge potential (i.e., ground potential) during the normal column operation. In addition, NMOS transistors MN37, MN38, MN39 and MN40 having a backward diode structure, inserted between each normal pre-decoding input signal and the ground voltage, prevents the normal pre-decoding input signal from being changed to an excessive negative potential state.

Figure 5:
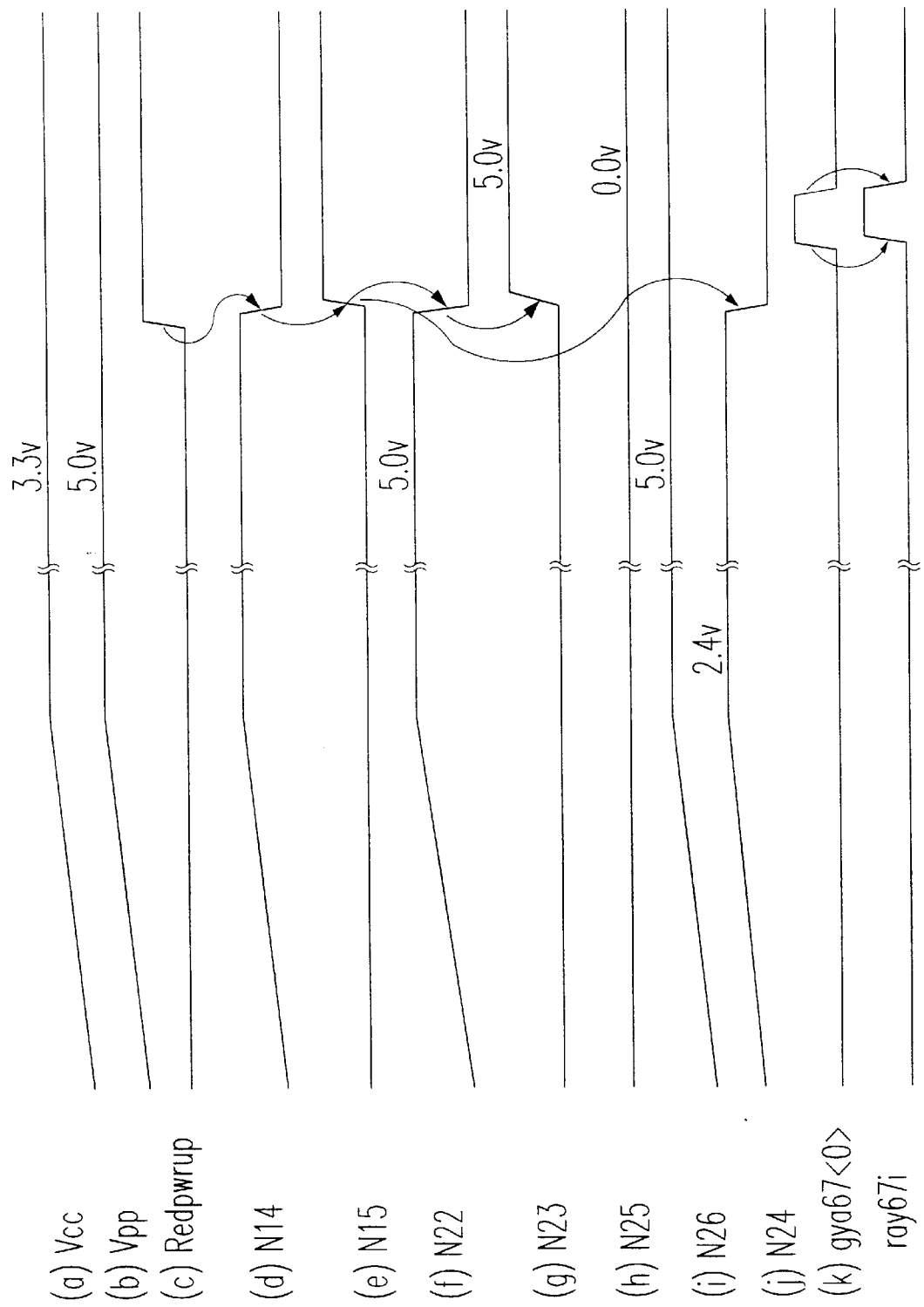
FIG. 5 is a timing diagram of a redundant column pre-decoder shown in FIG. 4 in accordance with a preferred embodiment of the present invention.

FIG. 5 sequentially illustrates an operation timing diagram of the defective column of FIG. 4. For example, FIG. 5 shows a timing diagram when all fuses F1, F2 and F3 are blown.

As described above, a redundant circuit of a synchronous DRAM according to the present invention drives a redundant decoder by using a redundant enable signal being generated after a power-supply voltage (or Vpp) and a plurality of input signals of the redundant decoder are reached to a stable state, and then performs a sensing and latch operations, thereby preventing a malfunction which may occur in the sensing and latch operations of the redundant decoder.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patent able novelty that reside in the present invention, including all features that would be treated as equivalents thereof by those skilled in the art which this invention pertains.

What is claimed is:

1. A synchronous DRAM for stabilizing a redundant operation, the synchronous DRAM comprising:

a memory cell array block made of a plurality of memory cells;

a row decoder for selecting and driving a word line;

a column decoder for selecting and driving a bit line;

a spare memory cell array block for substituting a defective cell, a defective word line or a bit line inside of the memory cell array block;

a spare row decoder for selecting a spare word line or a cell of the spare memory cell array block;

a spare column decoder for selecting a spare bit line or a cell of the spare memory cell array block, a column address pre-decoder which generates a plurality of decoded addresses needed by the column decoder, and connects them to a corresponding column decoder;

a redundant column pre-decoder which generates a fuse-programmable address needed by the spare column decoder;

a row address pre-decoder which generates a plurality of decoded addresses needed by the row decoder, and connects them to a corresponding row decoder;

a redundant row pre-decoder which generates a fuse programmable address needed by the spare row decoder; and a redundant enable signal generator which generates a global enable signal for driving both the redundant row pre-decoder and the redundant column pre-decoder, after a plurality of address inputs and a power-supply voltage are input to both the redundant column pre-decoder and the redundant row pre-decoder are reached to a stable state;

wherein the redundant row pre-decoder, the row address pre-decoder, the redundant column pre-decoder, and the column address pre-decoder are all simultaneously enabled by the global enable signal from the redundant enable signal generator.

2. The synchronous DRAM for stabilizing a redundant operation according to claim 1, wherein the redundant enable signal generator includes:

a power-up circuit which is connected between a power-supply voltage and a substrate voltage, and outputs a signal of sensing a variation of the power-supply voltage;

a mode register set command decoder circuit which outputs a first logic signal when receiving a mode register set command;

a signal selecting circuit which selects one of the output signal of the mode register set command decoder circuit and the output signal of the power-up circuit;

a latch circuit which is connected between the signal selecting circuit and an output terminal; and a driver circuit which is connected between the latch circuit and the output terminal by using even inverters.

3. The synchronous DRAM for stabilizing a redundant operation according to claim 1, wherein the redundant column pre-decoder includes:

first to third fuse circuits which output logic values different from one another according to a fuse state;

a control signal generator which outputs a signal mixed with output signal of the first fuse circuit and a redundant power-up signal;

a first switching element which is switched by an output signal of the first fuse circuit, and transmits a ground potential to an output terminal in a normal operation;

second to fifth switching elements for selecting a normal pre-decoding address signal, and outputting it to the output terminal; and a level shift circuit which receives a plurality of fuse-programmable address inputs from the second and third fuse circuits and then controls operations of the second to fifth switching elements, if an operation is activated by an output signal of the control signal generator and a plurality of output signals of the second and third fuse circuits.

* * * * *